US011289152B2

United States Patent
Wei et al.

(10) Patent No.: US 11,289,152 B2
(45) Date of Patent: Mar. 29, 2022

(54) IN-MEMORY MULTIPLY-ADD COMPUTING DEVICE ADAPTED TO PROCESS INPUT SIGNALS WITH IMPROVED ACCURACY

(71) Applicant: MACRONIX International Co., Ltd., Hsinchu (TW)

(72) Inventors: Ming-Liang Wei, Kaohsiung (TW); Po-Kai Hsu, Tainan (TW); Hang-Ting Lue, Hsinchu (TW); Teng-Hao Yeh, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/077,795

(22) Filed: Oct. 22, 2020

(65) Prior Publication Data

US 2021/0158857 A1    May 27, 2021

Related U.S. Application Data

(60) Provisional application No. 62/938,956, filed on Nov. 22, 2019.

(51) Int. Cl.

| | |
|---|---|
| *G11C 7/16* | (2006.01) |
| *G11C 11/4091* | (2006.01) |
| *G06F 9/38* | (2018.01) |
| *G11C 11/4076* | (2006.01) |
| *G11C 11/408* | (2006.01) |
| *G11C 16/26* | (2006.01) |
| *G11C 11/54* | (2006.01) |
| *G11C 7/10* | (2006.01) |

(52) U.S. Cl.
CPC ........ *G11C 11/4091* (2013.01); *G06F 9/3893* (2013.01); *G11C 7/1006* (2013.01); *G11C 7/16* (2013.01); *G11C 11/4076* (2013.01); *G11C 11/4085* (2013.01); *G11C 11/54* (2013.01); *G11C 16/26* (2013.01); *G11C 2207/063* (2013.01)

(58) Field of Classification Search
CPC ......... G11C 7/16; G11C 11/54; G11C 7/1006; G11C 16/26; G11C 11/4076; G11C 11/4085; G11C 2207/063; G06F 9/3893
See application file for complete search history.

(56) References Cited

U.S. PATENT DOCUMENTS

| | | | |
|---|---|---|---|
| 2020/0020393 A1* | 1/2020 | Al-Shamma | ........... G11C 16/08 |
| 2020/0211649 A1* | 7/2020 | Park | ........... G11C 29/04 |
| 2020/0301667 A1* | 9/2020 | Hung | ........... G11C 16/0483 |
| 2020/0410334 A1* | 12/2020 | Choi | ........... G11C 13/0028 |

* cited by examiner

*Primary Examiner* — Mushfique Siddique
(74) *Attorney, Agent, or Firm* — J.C. Patents

(57) ABSTRACT

An in-memory computing device including a plurality of memory cell arrays and a plurality of sensing amplifiers are provided. The memory cell arrays respectively receive a plurality of input signals. The input signals are divided into a plurality of groups. The groups respectively have at least one partial input signal. The at least one partial input signal of each of the groups has a same value. Numbers of the at least one partial input signal in the groups sequentially form a geometric sequence with a common ration equal to 2. The memory cell arrays respectively provide a plurality of weightings, and perform multiply-add operations respectively according to the received input signals and the weightings to generate a plurality of computation results. The sensing amplifiers respectively generate a plurality of sensing results according to the computation results.

9 Claims, 5 Drawing Sheets

IN-MEMORY MULTIPLY-ADD COMPUTING DEVICE ADAPTED TO PROCESS INPUT SIGNALS WITH IMPROVED ACCURACY

CROSS-REFERENCE TO RELATED APPLICATION

This application claims the priority benefit of U.S. Provisional Application No. 62/938,956, filed on Nov. 22, 2019. The entirety of the above-mentioned patent application is hereby incorporated by reference herein and made a part of this specification.

BACKGROUND

Technical Field

The invention relates to an in-memory computing device, and particularly relates to an in-memory computing device with improved accuracy.

Description of Related Art

Along with development of artificial intelligence, it is an important issue to provide chips with high-efficiency multiply-add computation capabilities in integrated circuits. In today's technology, it has become a mainstream to set up an in-memory computing device to perform multiply-add operations.

In a conventional in-memory computing device, a memory is often divided into a plurality of memory cell blocks, and results of multiply-add operations performed on the memory cell blocks are quantified and normalized, and then a plurality of digital shift circuits and accumulation circuits are used to sum up the multiply-add operation results to obtain a final result. According to such method, in case of a large number of input signals, the numbers of the digital shift circuits and the accumulation circuits may be greatly increased, resulting in increased circuit complexity. Moreover, the conventional in-memory computing device requires multiple quantization operations based on digitization processing operations. These quantization operations also cause errors in computation results and reduce computation accuracy.

SUMMARY

The invention is directed to an in-memory computing device, which is adapted to process a large number of input signals and reduce a delay time generated in a computation process.

The invention provides an in-memory computing device including a plurality of memory cell arrays and a plurality of sensing amplifiers. The memory cell arrays respectively receive a plurality of input signals. The input signals are divided into a plurality of groups. The groups respectively have at least one partial input signal. The at least one partial input signal of each of the groups has a same value. Numbers of the at least one partial input signal in the groups sequentially form a geometric sequence with a common ratio of 2. The sensing amplifiers are respectively coupled to the memory cell arrays. The memory cell arrays respectively provide a plurality of weightings, and respectively perform multiply-add operations according to the received input signals and the weightings to generate a plurality of computation results. The sensing amplifiers respectively generate a plurality of sensing results according to the computation results.

Based on the above description, in the invention, the sensing result is generated through pure analog multiply-add operations and current sensing operations. In this way, in the application of a large number of input signals, the necessary digital shift circuit is omitted, and it is unnecessary to set the digital accumulation circuit, which effectively reduces the complexity of circuit.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
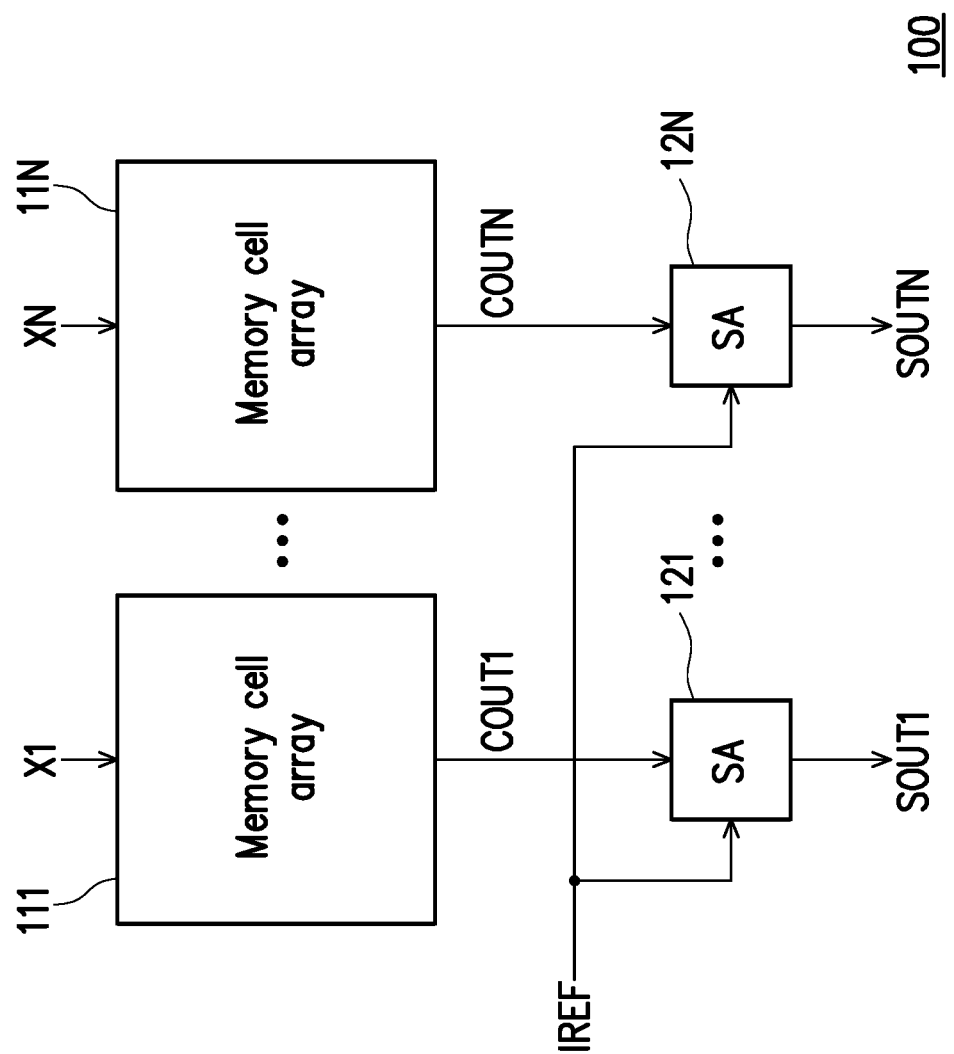
FIG. 1 is a schematic diagram of an in-memory computing device according to an embodiment of the invention.

Referring to FIG. 1, FIG. 1 is a schematic diagram of an in-memory computing device according to an embodiment of the invention. The in-memory computing device 100 includes a plurality of memory cell arrays 111-11N and a plurality of sensing amplifiers 121-12N. The memory cell arrays 111-11N respectively receive a plurality of input signals X1-XN. The input signals X1-XN may be divided into a plurality of groups. Each of the groups has one or a plurality of partial input signals in the plurality of input signals X1-XN. The partial input signals of each of the groups are the same. According to an arranging order, numbers of the partial input signals in the groups sequentially form a geometric sequence with a common ratio of 2.

In detail, the input signals X1~XN may include a plurality of input signal sub-sets Z1~ZH. Taking a sum of the input signal subsets=$a0+a1\times2^2+a2\times2^4$ as an example, in which the input signal subsets Z1-ZH may be set as seven partial input signals of a0, a1, a1, a2, a2, a2 and a2. The above seven partial input signals may be divided into three groups. The first group includes one partial input signal a0; the second group includes two partial input signals a1; and the third group includes four partial input signals a2. In the embodiment, the seven partial input signals a0-a2 may be respectively input to seven memory cell arrays. The memory cell arrays respectively perform multiply-add operations according to the corresponding partial input signals a0-a2 based on provided weightings, so as to generate a plurality of computation results.

In the embodiment, the memory cell arrays 111-11N perform the multiply-add operations to respectively generate a plurality of computation results COUT1-COUTN. The sensing amplifiers 121-12N receive a reference current IREF, and perform sensing operations on the computation results COUT1-COUTN based on the reference current IREF, and accordingly generate a plurality of sensing results SOUT1-SOUTN.

It should be noted that, in the embodiment of the invention, the multiply-add operations of the memory cell arrays 111-11N are performed based on signals in a full analog format. In other words, the computation results COUT1-COUTN are all analog format signals. Under such condition, the embodiment of the invention may reduce the number of quantization operations that cannot be avoided in a digitization processing mode, so as to effectively improve computation accuracy.

Through the computations of the full analog format, in the embodiment, it is unnecessary to set up digital shift register circuits and accumulation circuits in the in-memory computing device 100, which may effectively reduce the complexity of the circuit.

Taking an input signal of n bits and providing a weighting of m bits as an example, the embodiment of the invention may be implemented by $(2^n-1) \times (2^m-1)$ memory cells.

In the embodiment, the memory cell arrays 111-11N may be flash memory cell arrays composed of flash memory cells. The flash memory cells may provide different degrees of transconductances to serve as weightings through erasing operations or programming operations. The sensing amplifiers 121-12N may be implemented by any sensing amplifier circuit well known to those with ordinary knowledge in the art, without certain restrictions.

Figure 2:
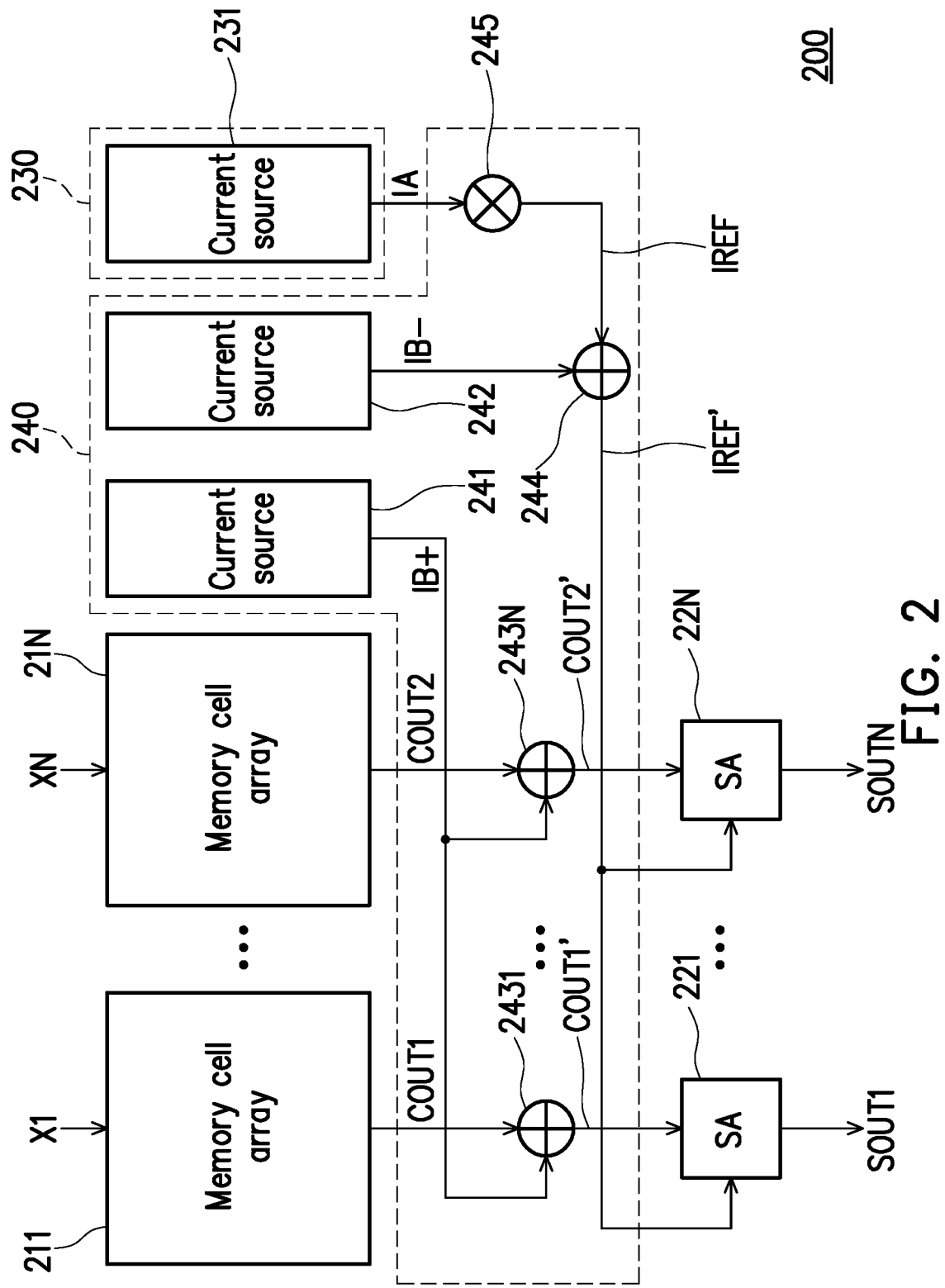
FIG. 2 is a schematic diagram of an in-memory computing device according to another embodiment of the invention.

Referring to FIG. 2, FIG. 2 is a schematic diagram of an in-memory computing device according to another embodiment of the invention. An in-memory computing device 200 includes memory cell arrays 211-21N, sensing amplifiers 221-22N, a reference current generator 230, and a normalization circuit 240. The memory cell arrays 211-21N respectively receive a plurality of input signals X1-XN, and perform multiply-add operations based on a plurality of provided weightings, and respectively generate a plurality of computation results COUT1-COUTN. The computation results COUT1-COUTN may be analog current signals.

A current IA generated by the reference current generator 230 is modulated by a reference current regulator 244 and a reference current multiplier 245 to generate a modulated current, and the modulated current can be transported to the sensing amplifiers 221-22N. In the embodiment, the reference current generator 230 includes a current source 231 and a current multiplier 232. The current source 231 is used to provide the current IA.

The normalization circuit 240 is coupled between the memory cell arrays 211-21N and the sensing amplifiers 221-22N. The normalization circuit 240 includes a plurality of current adders 2431-243N, the reference current multiplier 245, the reference current regulator 244, and current sources 241 and 242. First input terminals of the current adders 2431-243N are respectively coupled to the memory cell arrays 211-21N to receive the computation results COUT1-COUTN. Second input terminals of the current adders 2431-243N commonly receive a first current IB+. The first current IB+ is provided by the current source 241. The current adders 2431-243N respectively add the computation results COUT1-COUTN and the first current IB+ to respectively generate a plurality of adjusted computation results COUT1'-COUTN'.

The reference current multiplier 245 receives the current IA, multiplies the current IA by a scalar, and generates the reference current IREF. A first input terminal of the reference current regulator 244 receives the reference current IREF, and a second input terminal of the reference current regulator 244 receives a second current IB− provided by the current source 242. The reference current regulator 244 adds the reference current IREF and the second current IB− to generate an adjusted reference current IREF'. In the embodiment, the reference current regulator 244 is a current adder.

Moreover, in the embodiment, the adjusted reference current IREF' is provided to the sensing amplifiers 221-22N, and the adjusted computation results COUT1'-COUTN' are respectively provided to the sensing amplifiers 221-22N. The sensing amplifiers 221-22N may respectively sense the adjusted computation results COUT1'-COUTN' according to the adjusted reference current IREF' to generate a plurality of sensing results SOUT1-SOUTN.

It should be noted that taking the reference current IREF as 1/K times of the current IA as an example, the normalization circuit 240 may perform a normalization operation based on a value K(y−B), where y is a value of the sensing result SOUT1-SOUTN in the condition of that the K is 1 and B is 0, B is a difference between the first current B+ and the second current B−. In the embodiment of the invention, the first current B+ may be greater than the second current B−. Wherein the normalization circuit 240 performs an inverse normalization operation on the reference current IREF and the adjusted reference current IREF'. The inverse normalization operation corresponding the sensing results SOUT1-SOUTN is a normalization operation.

The above-mentioned normalization operation may implement layer-wise normalization of a neural network when being applied to the computation of the neural network.

The current adders 2431-243N, the reference current regulator 244, and the current multiplier 245 in the embodiment may all be implemented by operational circuits related to current addition and multiplication that are well known to those with ordinary knowledge in the art without specific restrictions. In addition, the current sources 241, 242, and 231 in the embodiment may be implemented by current source circuits well known to those with ordinary knowledge in the art without specific restrictions.

Figure 3:
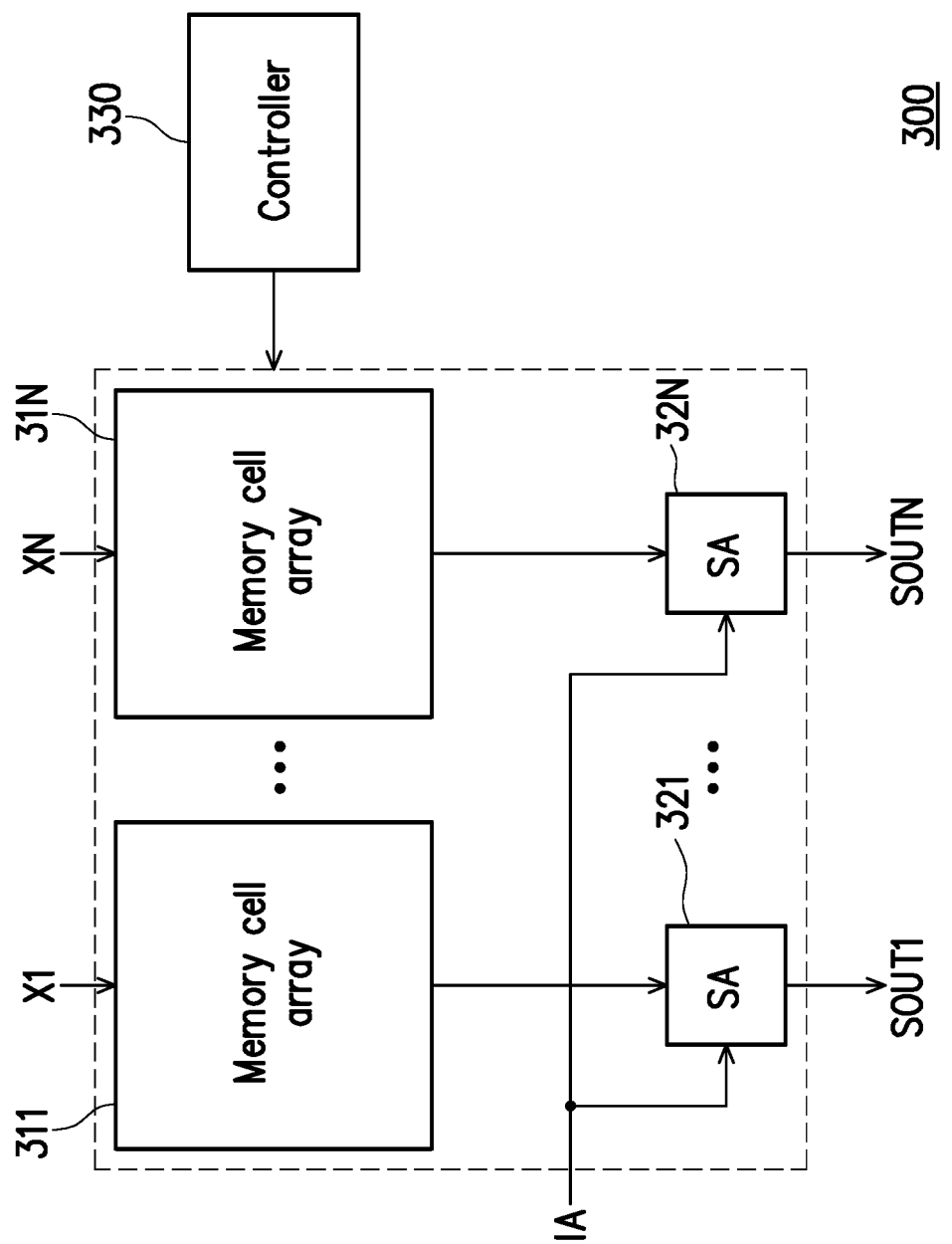
FIG. 3 is a schematic diagram of an in-memory computing device according to another embodiment of the invention.

Referring to FIG. 3, FIG. 3 is a schematic diagram of an in-memory computing device according to another embodiment of the invention. An in-memory computing device 300 includes a plurality of memory cell arrays 311-31N, a plurality of sensing amplifiers (SA) 321-32N, and a controller 330. The controller 330 is coupled to the memory cell arrays 311-31N and the sensing amplifiers (SA) 321-32N. In this embodiment, the sensing amplifiers (SA) 321-32N may perform sensing operation based on the current IA.

The controller 330 is used to control a work flow of computation operations performed by the in-memory computing device 300.

It should be noted that in the embodiment of the invention, the circuit in a dotted line box may also be implemented by the circuit of the embodiment of FIG. 2.

Figure 4:
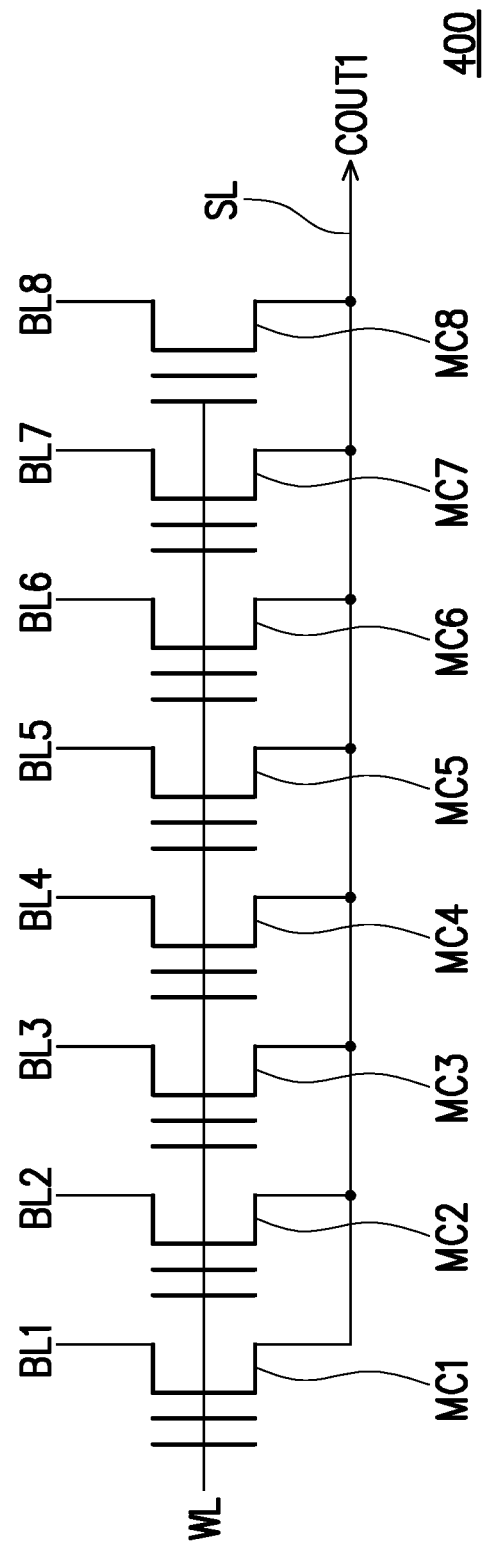
FIG. 4 is a schematic diagram of an implementation of a memory cell array according to an embodiment of the invention.

Referring to FIG. 3 and FIG. 4, FIG. 4 is a schematic diagram of an implementation of a memory cell array according to an embodiment of the invention. A memory cell array 400 includes a plurality of flash memory cells MC1-MC8 coupled in parallel. The memory cells MC1-MC8 are commonly coupled to a word line WL, respectively coupled to bit lines BL1-BL8, and commonly coupled to a source line SL. The memory cells MC1-MC8 receive input signals through the bit lines BL1-BL8, and respectively provide a plurality of weightings according to a plurality of transconductances. The memory cells MC1-MC8 generate the computation result COUT1 on the source line SL after the word line WL completes a setting operation (a word line voltage on the word line WL is pulled up).

Figure 5:
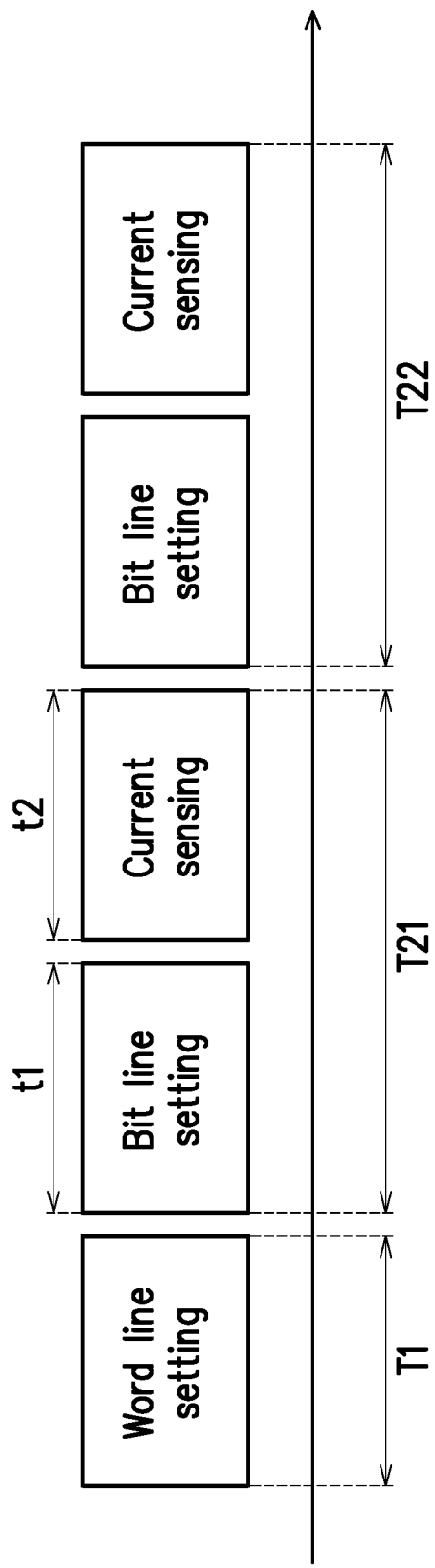
FIG. 5 is an operation flowchart of an in-memory computing device according to an embodiment of the invention.

Referring to FIG. 3 and FIG. 5, FIG. 5 is an operation flowchart of an in-memory computing device according to an embodiment of the invention. The controller 300 executes setting operations of multiple word lines of the memory cell arrays 311-31N in a first time interval T1, and controls the memory cell arrays 311-31N to consecutively execute multiple computation operations in a plurality of subsequent second time intervals T21 and T22. In detail, in the computation operations, taking the second time interval T21 as an example, in a sub-time interval t1, the controller 330 may perform voltage setting operations of the bit lines according to the input signals, such that the memory cell arrays 311-31N may perform multiply-add operations. Then, in a sub-time interval t2, the sensing amplifiers 221-22N may perform current sensing operations on the computation results COUT1-COUTN generated by the memory cell arrays 311-31N.

It should be noted that in the operation of the flash memory, the setting operations of the word lines take a relatively long time. In the embodiment of the invention, through the setting operation of a single word line, multiple computation operations may be performed consecutively. In this way, the time delay generated in the computation process may be effectively reduced to increase a speed of executing the computation operation.

In summary, in the invention, the memory cell arrays in the in-memory computing device perform the multiply-add operations under a full analog condition. In this way, there is no need to set up the digital shift circuits and the accumulation circuits, which effectively reduces the complexity of the circuit. In addition, the multiply-add operations performed under the full analog condition do not require the quantization operation, which effectively reduces errors that may be caused by the quantization operation and improves the computation accuracy.

What is claimed is:

1. An in-memory computing device, comprising:
a plurality of memory cell arrays, respectively receiving a plurality of input signals, wherein the input signals have $2^N-1$ partial input signals and are divided into a N groups, the groups respectively have at least one of the partial input signals, the at least one partial input signal of each of the groups has a same value, and numbers of the at least one partial input signal in the groups sequentially form a geometric sequence with a common ratio of 2, wherein N is an integer larger than 1; and
a plurality of sensing amplifiers, respectively coupled to the memory cell arrays,
wherein the memory cell arrays respectively provide a plurality of weightings, and respectively perform multiply-add operations according to the received input signals and the provided weightings to generate a plurality of computation results, and the sensing amplifiers respectively generate a plurality of sensing results according to the computation results.

2. The in-memory computing device as claimed in claim 1, wherein the computation results are signals of an analog format.

3. The in-memory computing device as claimed in claim 1, wherein each of the sensing amplifiers receives a reference current, and respectively senses the computation results according to the reference current to generate the sensing results.

4. The in-memory computing device as claimed in claim 3, further comprising:
a reference current generator, coupled to the sensing amplifiers, and configured to provide the reference current.

5. The in-memory computing device as claimed in claim 4, wherein the reference current generator comprises:
a current source, generating a current.

6. The in-memory computing device as claimed in claim 5, further comprising:
a normalization circuit, comprising:
  a plurality of current adders, respectively coupled between the memory cell arrays and coupling paths of the sensing amplifiers, and respectively adding the computation results and a first current to respectively generate a plurality of adjusted computation results;
  a current multiplier, receiving the current, and generating the reference current by modulating a current value of the current;
  a reference current regulator, receiving the reference current, and adding the reference current and a second current to generate an adjusted reference current,
wherein the sensing amplifiers respectively sense the adjusted computation results according to the adjusted reference current to generate the sensing results, the normalization circuit performs an inverse normalization operation on the reference current and the adjusted reference current, where the inverse normalization operation corresponding to the sensing results is a normalization operation.

7. The in-memory computing device as claimed in claim 6, wherein the normalization circuit further comprises:
a first current source, coupled to the current adders, and configured to generate the first current; and
a second current source, coupled to the reference current regulator, and configured to generate the second current.

8. The in-memory computing device as claimed in claim 1, further comprising:
a controller, coupled to the memory cell arrays, and configured to:
  perform setting operations of a plurality of word lines of the memory cell arrays in a first time interval; and
  respectively perform consecutive multiple computation operations in a plurality of second time intervals after the first time interval.

9. The in-memory computing device as claimed in claim 8, wherein in each of the computation operations, the controller controls the input signals to be transmitted to the memory cell arrays in a first sub-time interval, and in a second sub-time interval, the sensing amplifiers perform sensing operations on the computation results.

* * * * *